United States Patent [19]

Winter et al.

[11] Patent Number: 5,229,767
[45] Date of Patent: Jul. 20, 1993

[54] DECODER FOR CONVOLUTIONALLY ENCODED INFORMATION

[75] Inventors: Eric H. Winter, Oak Park; Ira A. Gerson, Hoffman Estates, both of Ill.

[73] Assignee: Motorola, Inc., Schaumburg, Ill.

[21] Appl. No.: 755,266

[22] Filed: Sep. 5, 1991

[51] Int. Cl.$^5$ .................................... H03M 13/12
[52] U.S. Cl. .............................. 341/50; 341/94; 371/43
[58] Field of Search .............. 341/50, 55, 94, 107; 371/43, 44, 45

[56] References Cited

U.S. PATENT DOCUMENTS

| | | | |
|---|---|---|---|
| 4,110,735 | 8/1978 | Maxemchuk | 371/43 |
| 4,119,945 | 10/1978 | Lewis, Jr. et al. | 371/43 |
| 4,369,512 | 1/1983 | Brossard et al. | 371/43 |
| 4,805,174 | 2/1989 | Kubota et al. | 371/43 |
| 4,823,346 | 4/1989 | Kobayashi et al. | 371/43 |
| 5,113,400 | 5/1992 | Gould et al. | 371/43 |

Primary Examiner—Howard L. Williams
Attorney, Agent, or Firm—Steven G. Parmelee; John W. Hayes

[57] ABSTRACT

In a Viterbi Algorithm decoder (204) as used to decode convolutionally encoded information, reliability information is developed for various path discard decisions made within the Viterbi Algorithm. These decisions are made for discard opportunities that impact one or more error detection windows (601). Based upon these metrics, a reliability factor sequence can be provided and compared against a fixed (or varying) threshold. When unreliability appears, appropriate action can be taken. For example, all of the information can be discarded, or only certain portions of the information can be discarded, as appropriate to the particular application.

18 Claims, 1 Drawing Sheet

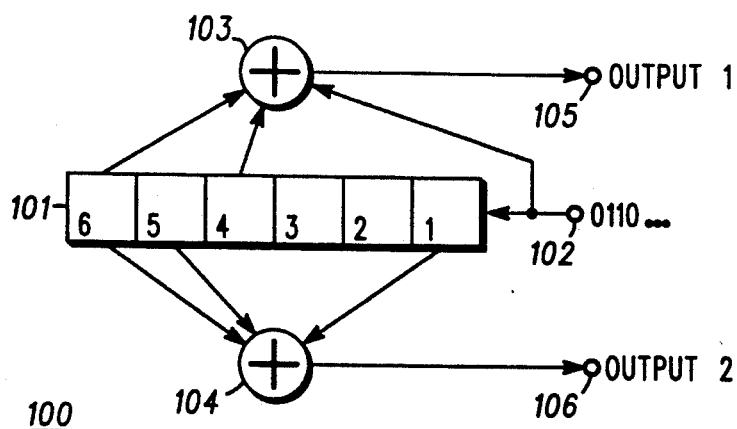
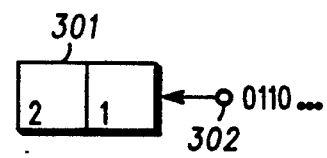
— PRIOR ART —
FIG.3
— PRIOR ART —
FIG.1
FIG.2
— PRIOR ART —
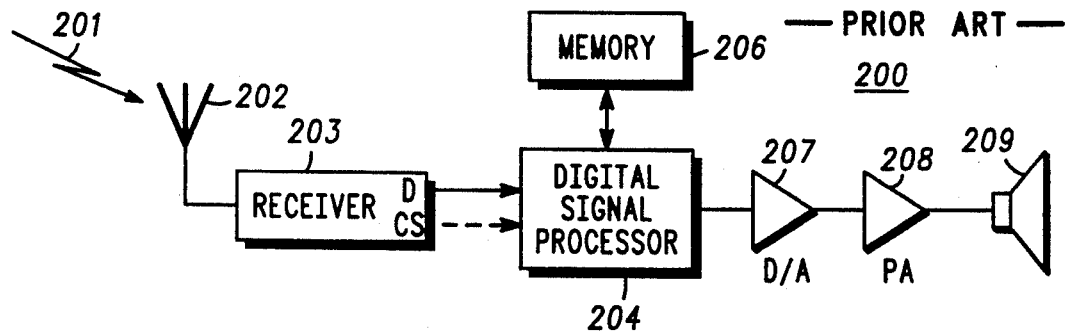
FIG.4
— PRIOR ART —
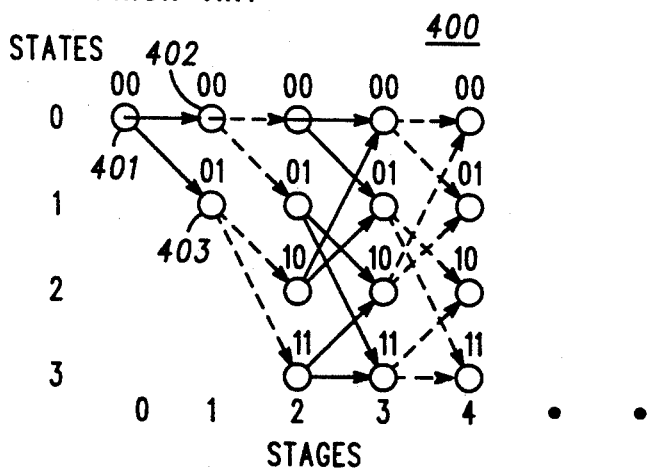
FIG.5
— PRIOR ART —
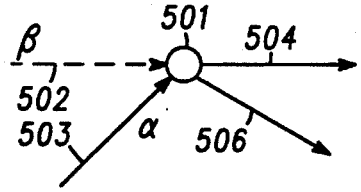
FIG.6
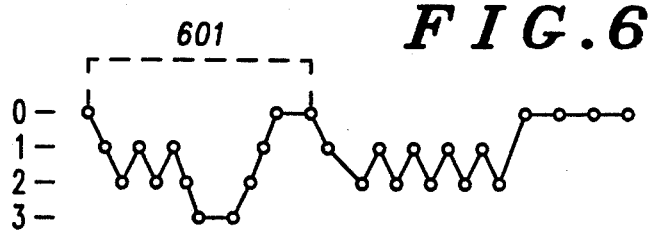

5,229,767

DECODER FOR CONVOLUTIONALLY ENCODED INFORMATION

FIELD OF THE INVENTION

This invention relates generally to decoders, including but not limited to decoders that decode convolutional encoded information.

BACKGROUND OF THE INVENTION

When communicating digital information from one point to another, prior art practitioners frequently encode that digital information to support a variety of purposes, including error correction. Convolutional encoding comprises one general form of particularly successful encoding technique. Unfortunately, convolutional codes do suffer from at least one disadvantage; they have no inherent error detection capability.

Prior art solutions to circumvent the above typically provide for concatenating the code with a cyclic redundancy check code. This solution unfortunately, allocates some of the fixed number of error control bits for error detection, thereby reducing the number of bits that remain for error correction.

Accordingly, a need exists for a method that can provide error detection capability when using convolutional codes without using an explicit error detection code, thereby allowing more bits to be utilized for improving error correction capacity.

SUMMARY OF THE INVENTION

These needs and others are substantially met through provision of the method and apparatus disclosed herein. Pursuant to the method, a decoder receives a convolutionally encoded stream of information. For a predetermined portion of the stream of information the decoder identifies a decoded information sequence. Reliability for part, but not all, of the decoded information sequence is then considered. When this reliability is less than a predetermined threshold, a predetermined action is taken.

In one embodiment of the invention, the predetermined action requires discarding the entire portion of the stream of information. In other embodiments, some of the information may be discarded, but not all of it.

In one embodiment of the invention, the decoder, from time to time, discards a first information path in favor of a second information path, and then determines reliability for that decision. These reliability measures can then be utilized to determine the reliability of the decoded information sequence itself to support the making of the above noted decisions.

BRIEF DESCRIPTION OF THE DRAWINGS

FIG. 1 represents a convolutional encoder;

FIG. 2 comprises a block diagram depiction of a receiver and decoder in accordance with the invention;

FIG. 3 depicts a two cell shift register in accordance with the invention;

FIG. 4 comprises a simplified representation of a four state trellis;

FIG. 5 diagrammatically represents path deletion pursuant to the Viterbi Algorithm and in accordance with the invention; and FIG. 6 comprises a depiction of an example maximum likelihood information path in juxaposition to an error detection window in accordance with the invention.

DESCRIPTION OF A PREFERRED EMBODIMENT

Prior to explaining an operating embodiment of the invention, it may be helpful to first briefly describe the convolutional encoding process. Referring to FIG. 1, a simple rate ½ encoder appears as depicted generally by reference numeral 100. A shift register (101), having six cells (1–6), receives at an input (102) a serial data stream. Taps provide information from preselected cells to two modulo two summers (103 and 104) (which generate the exclusive-OR of all input values), with each summer providing an independent output (105 and 106).

Configured as depicted, the first summer (103) will sum the entry bit, and the bits in cells 4 and 6, with the modulo two result being provided at output 1 (105). Similarly, the second summer (104) will combine the contents of cells 1, 5, and 6 and provide this result at output 2 (106). Such an embodiment effectively maps one information bit to two output bits, with one output bit each appearing at the two outputs (105 and 106). The ultimate output of this coder switches between these two outputs in order to provide a serial stream of the now convolutionally coded information.

The above embodiment can be revised in a variety of ways. For example, more cells to the shift register can be added. Also, additional summers can be added (the applicant prefers the use of three summers, therefore providing a rate ⅓ coder). Yet still further, the number and selection of taps can be varied as desired.

Typically, this convolutionally encoded information will be utilized as a modulation input for a transmitter, which then modulates an appropriate carrier. In this embodiment, it will be presumed that the carrier comprises a radio frequency carrier.

A radio receiver and decoder (200) appears in FIG. 2. An antenna (202) receives the carrier (201) having the convolutionally encoded information modulated thereon. An appropriate radio receiver (203) demodulates this information in order to extract the convolutional encoded data, which information is provided to a digital signalling processing platform (204) (such as a DSP 56000 or DSP 96000 family device as manufactured and sold by Motorola, Inc.). The digital signal processor (DSP) (204) performs a variety of functions, including decoding and control functions as described below in more detail. An associated memory (206) allows programming information and/or other data to be held available for use by the DSP (204).

In this embodiment, it will be presumed that the initially encoded information comprises speech coding information, which the DSP (204) decodes. The resultant digitized synthesized speech is then provided to a digital to analog convertor (207), with the resultant analog output then being amplified in a power amplifier (208) and rendered audible by a loudspeaker (209).

The above generally described components are well understood in the art, both individually and in the combination depicted. Therefore, additional information will not be provided except where particularly appropriate to an understanding of this invention. It should also be understood that the invention is operable in a variety of operating platforms, and is not limited to the particular speech decoding and synthesis platform suggested, or to speech processing platforms in general.

Referring now to FIG. 3, the demodulated and recovered information bits of the convolutionally encoded stream of information are effectively processed in the DSP (204) through a two cell shift register (301). These bits enter through an input (302) and are serially processed. The purpose of this is to provide a two bit data word that can be entered into a Viterbi Algorithm decoder.

The Viterbi Algorithm is well understood by those skilled in the art, and is particularly understood to be useful in decoding convolutionally encoded information. Processing the Viterbi Algorithm with respect to a frame comprising an incoming stream of data such as that suggested by the two bit words referred to in FIG. 3 will typically yield a trellis (400) as depicted in FIG. 4. In the particular simplified trellis (400) depicted, there are four possible states (0-3) that each two bit word can have, ranging from 00 to 11. Each opportunity for a two bit word constitutes a stage, with there being as many stages as desired to accommodate a particular application. (In the present preferred embodiment, the applicant provides for 32 states and 77 stages.)

In the beginning, in this embodiment, the two bit word will include only an initial 00 word, and this would of course be located in the 00 position (state 0) at stage 0 as depicted by reference numeral 401. (In this embodiment, each frame both begins and ends with a predetermined number of predetermined information values; in this case, the encoder begins in the 00 state and concludes with two 0's. The next bit that enters the first cell of the two stage register (301) will either be a 0 or a 1. If a 0, then the two bit word will remain 00, and the stage 1 information symbol will reside at state 0 as depicted by reference numeral 402. Further, a path will be identified coupling the current and the previous symbol. Conversely, if the next bit constitutes a 1, thereby yielding a 01 word, then stage 1 will have a state 1 symbol as depicted by reference numeral 403. Again, a path will be defined between the stage 1 symbol and the stage 0 symbol.

The above process will continue as data continues to be fed into the two cell shift register (301). As represented in FIG. 4, each subsequent stage can only have a symbol in a state that corresponds to an allowable state, given the preceding paths and states. The Viterbi Algorithm functions to ultimately identify one particular decoded information sequence through all of the possible symbol states for all possible stages that represents the maximum likelihood information sequence. Further, when making this decision, the Viterbi Algorithm is computationally efficient, in that it allows for certain potential paths to be discarded from time to time, even while processing of additionally incoming symbols proceeds.

More particularly, the Viterbi Algorithm essentially comprises a maximum likelihood process that includes, as a key computation, a computation of survivor metrics; i.e., some paths survive and some do not during processing of the Viterbi Algorithm. By discarding some paths, the Viterbi Algorithm remains computationally efficient. At the same time, of course, by discarding some paths from time to time, a potential for error arises. If a decision to discard must be made at a time when only equivocal information is available as to a likelihood that one path of many is a particularly better choice than the others, a decision to discard made at that time may lead to erroneous results ultimately.

All of the above is well understood in the art, and additional detailed information will not be particularly helpful here. The reader interested in additional information regarding Viterbi decoding of convolutional codes may wish to consider the article entitled, "The Viterbi Algorithm" by G. David Forney, Jr., as appears in the March, 1973 issue of The Proceedings of the IEEE.

FIG. 5 illustrates a symbol (501) which, consistent with the simplified example presented in FIG. 4, has only two paths leading to it (502 and 503) from preceding states in the preceding stage. Similarly, there are only two paths (504 and 506) leading from this state (501) to the next stage. For purposes of this example, it may be presumed that the Viterbi Algorithm has concluded that a first one of the incoming paths (502) should now be discarded, retaining only a second incoming path (503). As noted earlier, this discarding process ensures the computational efficiency of the process. Pursuant to this invention, however, a measure of the reliability of this path discard decision will be made as well.

In particular, the likelihood that the first path (502) represented a correct path can be assigned a likelihood metric noted here as beta, whereas a similar metric for the second path (503) will be represented here as alpha.

With the above thoughts in mind, the following discussion will now describe in greater detail the applicant's method. This embodiment uses a modified Viterbi Algorithm to decode the convolutional code. The basis for selection or deletion of a path, a possible information vector x, is the path metric. The path metric may be calculated using the following formula:

$$\Gamma_j^{(S)} = \sum_{i=1}^{2S} (v_j^{(S)}(i) - r(i))^2, \text{ where } 1 \leq S \leq L + m$$

In the above equation, vector element $v_j^{(s)}(i)$ corresponds to the $i^{th}$ element of the partial codevector $v_j^{(s)}$. S is the current stage in the decoding trellis. The $\Gamma_j^{(s)}$ variable is the value of the path metric at stage S for stage j. r(i) corresponds to the $i^{th}$ bit of the received information sequence r. L refers to the total number of bits, and m indicates that the memory order of the convolutional code.

The standard Viterbi algorithm uses the path metric to determine which paths to retain (the survivor) and which to delete. Since the path metric is a reflection of the likelihood of a particular path, one can compare the likelihoods of two paths by subtracting their respective path metrics.

$$\Delta_{jk}^{(s)} = \Gamma_j^{(s)} - \Gamma_k^{(s)},$$

where $j \neq k$.

$\Delta_{jk}^{(s)}$ is the path metric difference between the paths from states j and k (or $x_j^{(s)}$ and $x_k^{(s)}$ at stage S. If delta is positive then $x_k^{(s)}$ is the survivor; if negative then $x_j^{(s)}$ is the survivor. A small value of delta indicates an unsure decision. This delta is used here to determine the likelihood of an error in a window of consideration. With the path metric difference at stage S, one now considers the two candidate decoded paths $x_k^{(s)}$ and $x_j^{(s)}$. There are two possible situations:

$$(x_j^{(s)} \oplus x_k^{(s)})^\frown w^{(s)} = 0, \text{ then discard } \Delta_{jk}^{(s)}$$

$$(x_j^{(s)} \oplus x_k^{(s)})^\frown w^{(s)} \neq 0, \text{ then save } \Delta_{jk}^{(s)}.$$

In the above equations, $x_j^{(S)}$ represents the estimated information sequence at stage S for state j and w represents the window of consideration (as explained below).

In the case where the vector operation results in the zero vector, the candidate paths are identical within the window. If the paths are not identical within the window, delta is saved for later evaluation.

There will be some situations where $x_j^{(S)}$ is guaranteed to be identical to $x_k^{(S)}$. In this situation one does need to exclusive or, or store the deltas. For example, this would happen if all paths had merged after the end of the window.

Similarly, if the window does not begin until stage S', then one need not save any deltas while S<S'. This particular configuration is particularly efficient.

Many of the calculated deltas will lie along paths that are ultimately deleted. We consider only those deltas which lie along the final surviving path. Using the decoded information sequence, it can be determinedd which deltas are to be considered.

Of this set of considered deltas one chooses the minimum and compares it to a threshold. If delta is below the threshold, the data is identified as being unreliable.

Essentially, then, an overall concept of reliability can be developed for various path discard decisions made during the processing of the Viterbi Algorithm, and this result is then available to make subsequent determinations regarding the overall resultant information path, as described below.

A final maximum likelihood information sequence (600) appears in FIG. 6 as, for purposes of this example, determined by the above described process. The discard reliability measurements referred to above can be made during the calculation of the maximum likelihood information sequence, or subsequent to its identification. In the case of the former, one simply needs to ensure that adequate memory exists to retain the various values that are calculated, such that those values will be available for use subsequent to identification of the maximum likelihood information sequence itself. The latter process requires an additional level of computational activity, but does have the benefit of only requiring reliability calculations to be performed for those discard decisions that are relevant to the states that comprise the maximum likelihood information sequence (600) itself. (In the applicants' preferred embodiment, the calculations are made during the course of constructing the information path itself.)

In this embodiment, the reliability metrics are made for only some of the discard decisions. For example, as depicted in FIG. 6, only a predetermined portion (601) of the maximum likelihood information sequence has been selected for the reliability inquiry. Discard decisions (which may or may not be within the window itself) that are positioned to influence reliability within this predetermined portion (601) are then the only decisions considered.

This approach is particularly appropriate when the information bits represented within the information path are not all equally important with respect to one another as regards reconstructing an ultimate message. For example, as noted earlier, in this particular embodiment the information contained within the information path represents speech coding. In speech coding, some bits are far more important to ultimate reconstruction of an audible message than are others. These more critical elements of information are placed within that window (601) depicted. A number of benefits result from this approach. First, computational requirements to support the error detection function are minimized, since reliability measurements are only made as relevant to the window (601). If reliability of decoded information within the window (601) appears suspect, a decision can be made to discard the entire frame of information, since a lack of the critical bits within the frame (601) may preclude any likelihood that any of the information within the frame can be used in a useful manner.

With the above in mind, it should be noted that the window could be positioned anywhere along the maximum likelihood information sequence, or could even be parsed, picket fence style, to ensure protection of distributed critical bits.

The concepts described above may be extended further by using an adaptive threshold against which the reliability measurement can be compared. This would allow one to trade off error detection versus correction capabilities to meet the needs of a particular application. The threshold could be allowed to vary through a variety of mechanisms. For example, the threshold could be varied by using a long term average of the window outputs. This would effectively reflect current average channel conditions.

Other functions are also possible. For example, the primary function served by the above described process is to detect an error within the error detection window. By raising the threshold above what is needed to catch window errors, the process will cause frames to be rejected for other reasons as well. This can be used to advantage. Those frames which do not have a window error but which have a low window output are likely to have decoded errors somewhere in the trellis. For some channels it is better to reject those frames. Since this process gives a good indication of the decoding capability of the code at the current frame, it is an ideal tool for rejecting these frames.

Also, this concept can be extended to codes that are not rate 1/n convolutional codes or their punctured derivative. Here one would find the path metric difference between the survivor and the closest deleted path. Note that the closest deleted path is the closest path which differs from the survivor within the window.

One other alternative embodiment should be noted. With reference to FIG. 2, channel state information (temporally associated with respective portions of the maximum likelihood information sequence) of various kinds can be developed in accordance with prior art technique by the receiver (203) and this channel state information (CS) can then be provided to the DSP (204) for use in further refining the decoding process and the reliability assessments. With respect to the use of channel state information in a Viterbi Algorithm, the reader is particularly referred to copending application Ser. No. 723,107 filed on Jun. 28, 1991 by Wilson et al., entitled "Signal Decoding Method Using Both Signal And Channel State Information," the above being commonly assigned herewith and being incorporated herein by this reference.

A number of benefits result through provision of the above described invention. Error detection becomes possible in a convolutional decoder without requiring information bits that are dedicated to this function. This will support either lower data rate transmissions, or same data rate transmissions wherein the bits not used for error detection can be used for other purposes, such as error correction.

What is claimed is:

1. A method for decoding convolutionally encoded information, comprising the steps of:
   A) receiving a convolutionally encoded stream of information;
   B) providing a decoder;
   C) for a predetermined portion of the stream of information, using the decoder to identify a decoded information sequence;
   D) determining reliability for part, but not all, of the decoded information sequence, by considering, at least in part, reliability of path discard decisions;
   E) when the reliability is less than a predetermined threshold, taking a predetermined action in response thereto.

2. The method of claim 1, wherein the predetermined portion of the stream of information represents a frame of the convolutionally encoded stream of information.

3. The method of claim 2 wherein the frame begins and ends with predetermined information values.

4. The method of claim 1 wherein the step of using the decoder includes the step of:
   C1) from time to time discarding a first information path in favor of a second information path; and
   C2) determining reliability for the first information path and the second information path; wherein the decoded information sequence includes the second information path.

5. The method of claim 4, wherein the step of determining reliability of the decoded information sequence includes the step of considering the reliability previously determined for the first information path and the second information path.

6. The method of claim 5, wherein the step of considering the reliability previously determined for the first information path and the second information path includes the step of comparing the determined reliability for each of the first and second information paths against one another.

7. The method of claim 1, wherein the part of the decoded information sequence for which reliability is determined comprises a predetermined portion of the decoded information sequence.

8. The method of claim 1, wherein reliability is determined for that part of the decoded information sequence that includes particularly critical information.

9. The method of claim 1, wherein the predetermined action includes discarding at least part of the information represented by the decoded information sequence.

10. The method of claim 1, wherein the predetermined action includes discarding all of the information contained within the predetermined portion of the stream of information.

11. A method for decoding convolutionally encoded information, which convolutionally encoded information is provided on a frame-by-frame basis, comprising the steps of:
    A) receiving a frame of the convolutionally encoded information;
    B) providing a Viterbi Algorithm decoder;
    C) for the frame, using the Viterbi Algorithm decoder to identify a decoded information sequence by:
       i) from time to time discarding a first information path in favor of a second information path;
       ii) determining reliability for the first information path and the second information path; wherein the decoded information sequence includes the second information path;
    D) determining reliability for part, but not all, of the decoded information sequence by comparing the reliability for the second information path against the reliability for the first information path;
    E) when the reliability of the decoded information sequence is less than a predetermined threshold, taking a predetermined action in response thereto.

12. The method of claim 11, wherein reliability for the first information path and the second information path is determined only when the first and second information paths are positioned to influence reliability within a predetermined window of the decoded information sequence.

13. The method of claim 12, wherein the predetermined window is positioned, with respect to the decoded information sequence, to include particularly critical information.

14. The method of claim 13, wherein the predetermined action includes discarding all of the information contained within the predetermined portion of the stream of information.

15. A decoder, comprising:
    A) input means for receiving a convolutionally encoded stream of information;
    B) Viterbi Algorithm decoder means operably coupled to the input means for:
       i) receiving the convolutionally encoded stream of information;
       ii) using a Viterbi Algorithm to identify a decoded information sequence for a predetermined portion of the stream of information;
       iii) determining reliability for part, but not all, of the decoded information sequence, by considering, at least in part, reliability of path discard decisions;
    C) control means operably coupled to the Viterbi Algorithm decoder means for receiving information regarding the reliability, and for automatically initiating a predetermined action in response thereto.

16. The decoder of claim 15, wherein the predetermined action includes discarding at least some of the information represented by the decoded information sequence.

17. A decoder, comprising:
    A) input means for receiving a convolutionally encoded stream of information;
    B) Viterbi Algorithm decoder means operably coupled to the input means for:
       i) receiving the convolutionally encoded stream of information;
       ii) using a Viterbi Algorithm to identify a decoded information sequence for a predetermined portion of the stream of information by:
          a) from time to time discarding a first information path in favor of a second information path;
          b) determining reliability for the first information path and the second information path;
          wherein the decoded information sequence includes the second information path;
       iii) determining reliability for part, but not all, of the decoded information sequence, by comparing the reliability for the second information path against the reliability for the first information path;
    C) control means operably coupled to the Viterbi Algorithm decoder means for receiving information regarding the reliability, and for automatically initiating a predetermined action in response thereto.

18. The decoder of claim 17, wherein the predetermined action includes discarding at least some of the information represented by the decoded information sequence.

* * * * *